United States Patent [19]

Hirose et al.

[11] 4,313,149

[45] Jan. 26, 1982

[54] ELECTRONIC EQUIPMENT ENCLOSURE CONNECTING STRUCTURE

[75] Inventors: Yoshinao Hirose, Kawasaki; Haruhiko Yamamoto, Yokohama; Keizo Suzuki, Tokyo; Isao Fukuchi; Masahiro Tsuchiya, both of Sagamihara, all of Japan

[73] Assignee: Fujitsu Limited, Kawasaki, Japan

[21] Appl. No.: 153,677

[22] Filed: May 27, 1980

[30] Foreign Application Priority Data

Aug. 6, 1979 [JP] Japan .................................. 54-72050

[51] Int. Cl.³ .............................................. H05K 7/02
[52] U.S. Cl. .................................. 361/394; 312/223; 312/198; 361/428

[58] Field of Search ............. 206/504; 220/23.4; 312/107, 111, 198, 199, 223; 361/331, 380, 390, 391, 393, 394, 420, 428, 429

[56] References Cited

U.S. PATENT DOCUMENTS

| 2,788,470 | 4/1957 | Giel ...................................... 361/394 |
| 3,567,302 | 3/1971 | Carlson ............................... 312/198 |
| 3,691,432 | 9/1972 | Edfors ................................. 361/394 |

*Primary Examiner*—Gerald P. Tolin
*Attorney, Agent, or Firm*—Daniel Jay Tick

[57] ABSTRACT

Each of at least two enclosures accommodates an electronic equipment unit and each has a plurality of corners. The enclosures are connected to each other at a corner overlap portion of each. An interconnecting cable, electrically connecting the electronic equipment units to each other, extends through the corner overlap portions.

6 Claims, 11 Drawing Figures

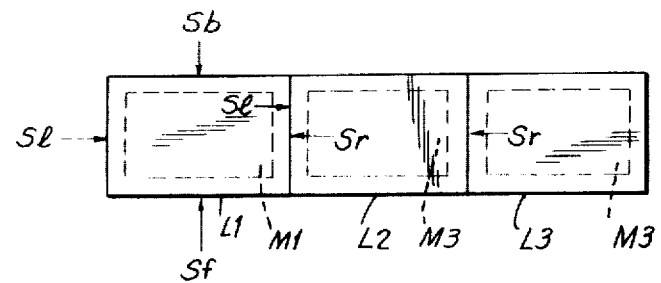
FIG. IA
PRIOR ART
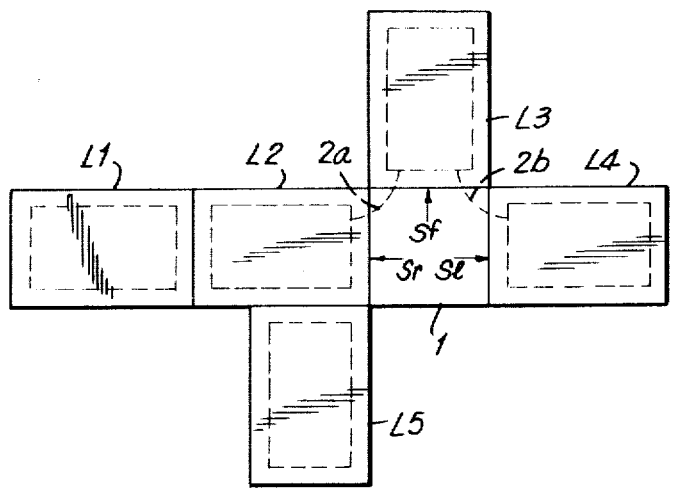
FIG. IB
PRIOR ART
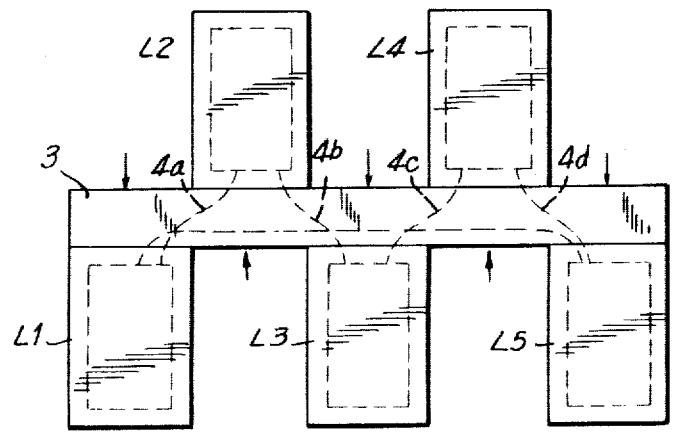
FIG. IC
PRIOR ART

ELECTRONIC EQUIPMENT ENCLOSURE CONNECTING STRUCTURE

BACKGROUND OF THE INVENTION

The present invention relates to an enclosure connecting structure. More particularly, the invention relates to an electronic equipment enclosure connecting structure.

The enclosure connecting structure of the invention is used in a system consisting of a plurality of enclosures accommodating electronic equipment, similar to a large scale electronic computer system enclosure connecting structure which is excellent in maintainability of internal electronic equipment and requires short inter-equipment connecting cable length.

In a simple enclosure connecting structure of the prior art, a plurality of enclosures are closely arranged linearly. The enclosures accommodate electronic equipment and each enclosure is structured, for example, in the form of a locker. The electronic equipment accommodated in each enclosure is generally a multisurface rack structure including a single or plural and fixed or movable rack structure accommodating many printed circuit board units, power supply and cooling parts, etc. The equipment of the different enclosures is mutually connected via cable for sending and receiving signals. In the simple structure, however, the signal transmission time is a little delayed in accordance with the length of the connecting cable. Thus, in order to improve the operating speed of a computer system, the length of the connecting cable must be reduced. Therefore, enclosures used for a high speed operation are often arranged with their sides located in close proximity. On the other hand, in order to provide maintenance after delivery and installation on the user's premises, it is desirable that all surfaces of internal equipment, front and back, right and left, be exposed when the enclosure door is opened. This permits checking and maintenance from four sides, front and back, right and left. The enclosures are closely arranged, however, because of the cable length problem hereinbefore mentioned, since this is currently considered as the most important problem. For this reason, access or maintenance from the right side is lost for the left-most enclosure, while access or maintenance from both sides, right and left, are lost for the center enclosure.

As hereinbefore explained, the connecting structure makes maintenance from the side impossible, where the enclosures are closely arranged. These sides should thus have a structure which does not require any maintenance, thereby imposing a considerable restriction on the system design. Otherwise, it is necessary to stop the operation of the system, disconnect the cables, and separate the enclosures, in order to provide maintenance for the equipment.

Furthermore, advancement in high integration density of semiconductor parts provides an increase of input-output signal terminals of the printed circuit board unit mounting the equipment. This places a shelf and rack accommodating the equipment in a position which requires connecting terminals in multiple faces; that is, it increases the sides which require checking and maintenance. This tendency becomes distinctive as a system becomes large in scale, having more circuits in the higher integration density.

In another enclosure connecting structure of the prior art, an empty enclosure, which does not accommodate any electronic equipment for the purpose of connection, is provided. Each side of the empty enclosure is closely placed face to face with other enclosures through the inter-enclosure connection. Cables extending through the empty enclosure interconnect the equipment. The enclosures may thus be maintained, even at the connecting side, from the direction of the empty enclosure. Two of the enclosures may be maintained from all sides. A close layout is provided for the side which does not always require maintenance. In such a structure, the maintenance surface may be assured by providing the empty enclosure at the side where accessibility of maintainability is lost due to the close arrangement. However, the length of the cable becomes long and, simultaneously, a particular connecting enclosure must be provided, resulting in an increase of cost and an increase of useless installation space which cannot be used freely.

In still another connecting structure of the prior art, a longer connecting bus enclosure is used and the enclosures are arranged in zig-zag fashion on both sides of the bus enclosure through an inter-enclosure connection, with cables extending in said bus enclosure. In this case, the enclosures may be connected by the bus connection method, and the embodiment is particularly suitable for a large scale system. However, the lengths of the connecting cables become long, as in the foregoing embodiment, and maintenance of the enclosure at the side of the connecting or bus enclosure must be accomplished from the rear through said connecting enclosure, requiring extra installation space of said enclosure and thus increasing the cost.

The principal object of the invention is to provide an electronic equipment enclosure connecting structure which eliminates all the problems of known enclosure connecting structures.

An object of the invention is to provide an electronic equipment enclosure connecting structure which permits maintenance of, and access to, the equipment of a desired enclosure from several surfaces without use of a particular enclosure for connection.

Another object of the invention is to provide an electronic equipment enclosure connecting structure which shortens the length of the inter-enclosure connecting cables.

BRIEF SUMMARY OF THE INVENTION

In accordance with the invention, enclosures of an electronic equipment enclosure connecting structure are directly connected at portions near the corners of the sides of the enclosures, and the interconnecting cable extends through the connected corner portions.

In accordance with the invention, an electronic equipment enclosure connecting structure for electronic equipment units, the electronic equipment units being electrically connected to each other by an interconnecting cable, comprises at least two enclosures, each accommodating an electronic equipment unit and each having a plurality of corners. The enclosures are connected to each other at a corner overlap portion of each. The interconnecting cable extends through the corner overlap portions.

Each of the enclosures has a plurality of sides. Each of the electronic equipment units has a plurality of sides each spaced from a corresponding side of the enclosure accommodating it. The interconnecting cable further extends in spaces between corresponding sides of the enclosures and the electronic equipment units.

Each of the enclosures is a rectangular parallelepiped and at least one of the enclosures has a plurality of doors. Each of the doors is in a corresponding one of a plurality of the sides, for access to the electronic equipment units.

Each corner of each of the enclosures is chamfered.

Each of the enclosures has a side in face-to-face relation with that of the other and spaced opposite ends, each having a corner thereat. The enclosures abut each other at an overlapping corner part of the sides. A connecting frame between the enclosures secures the enclosures to each other.

Each of the enclosures has a side in face-to-face relation with that of the other and spaced opposite ends, each having a corner thereat. The enclosures abut each other at an overlapping corner part of the sides. Each of the enclosures has a door in the side for access to the electronic equipment units. Each of the doors is spaced from the ends of its corresponding side. Each of a pair of side panels is affixed to a corresponding one of the sides around the corresponding door.

BRIEF DESCRIPTION OF THE DRAWINGS

In order that the invention may be readily carried into effect, it will now be described with reference to the accompanying drawings, wherein:

FIG. 1A is a plan view of an embodiment of a known electronic equipment enclosure connecting structure;

FIG. 1B is a plan view of another embodiment of a known electronic equipment enclosure connecting structure;

FIG. 1C is a plan view of still another embodiment of a known electronic equipment enclosure connecting structure;

DETAILED DESCRIPTION OF THE INVENTION

Figure 2:
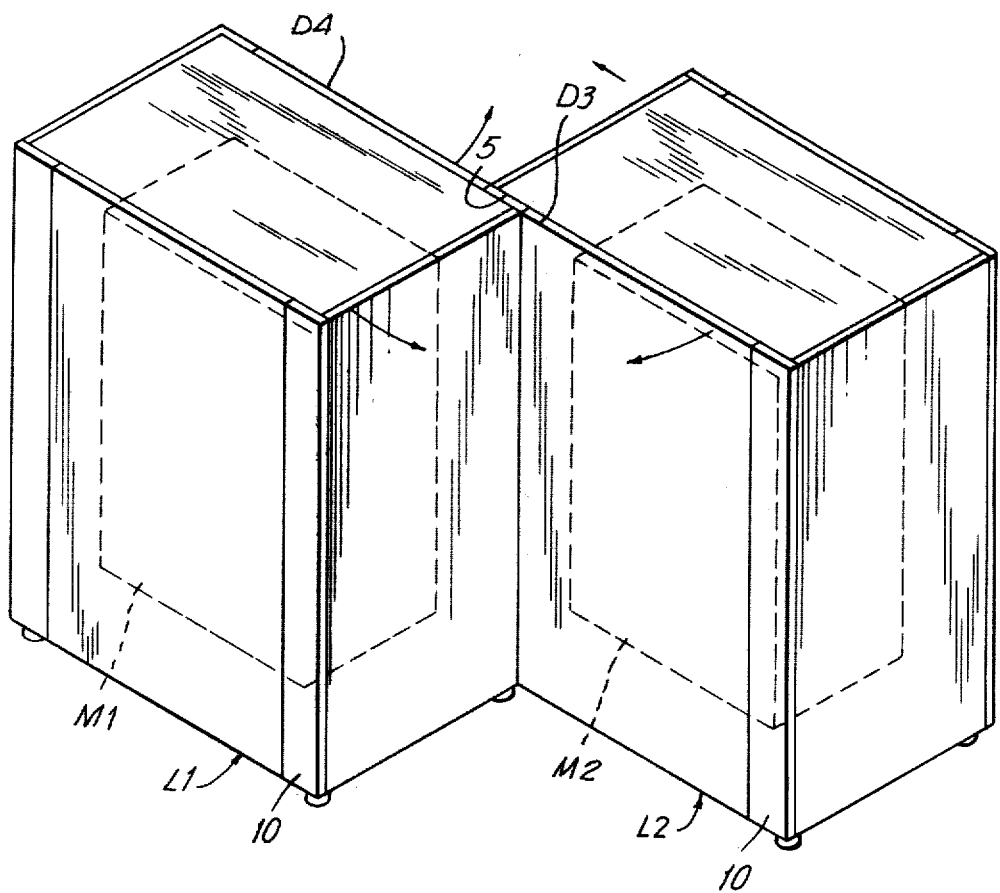
FIG. 2 is a perspective view, on an enlarged scale, of the electronic equipment enclosure connecting structure of the invention for two enclosures.

FIGS. 1A, 1B and 1C show known enclosure connecting structures. The embodiment of FIG. 1A is the most simple of the known enclosure connecting structures. In FIG. 1A, a plurality of enclosures L1, L2, . . . are closely arranged linearly. The enclosures L1, L2, . . . accommodate electronic equipment M1, M2, . . . , respectively. Each enclosure is structured, for example, in the form of a locker and the electronic equipment accommodated in the enclosure is generally composed of a multisurface rack structure including a single or plural and fixed or movable rack structure accommodating many printed circuit board units, power supply and cooling parts, etc.

The accommodated equipment units M1, M2, M3, . . . are mutually connected via cables for sending and receiving signals. In this case, however, signal transmission time is a little delayed in accordance with the length of the connecting cable. Thus, in order to improve the operating speed of a computer system, the length of the connecting cables must be shortened. The enclosures L1, L2, . . . used for s high speed operation are therefore often arranged with the sides located in close proximity.

On the other hand, when the enclosure connecting structure is to be maintained after delivery and installation on the user's premises, it is desirable that all the surfaces of the internal equipment, front and back, right and left, be exposed when the door of the enclosure is opened, and that checking and maintenance may be accomplished via all four sides, front and back, right and left, as indicated by arrows Sf, Sb, Sl and Sr. However, the enclosures are arranged in close proximity, because of the aforementioned problem of cable length, which is currently considered as the most important problem. For this reason, access and maintenance from the right side, indicated by the arrow Sr, is lost for the left-most enclosure L1, while access and maintenance from both sides, right and left, indicated by the arrows Sl and Sr are lost for the center enclosure L2. As herein before explained, the known enclosure connecting structure prevents access or maintenance from the side where the enclosures are closely arranged. These sides should thus have a structure which does not require any maintenance, thereby imposing a considerable restriction on the design of the system. Otherwise, it is necessary to stop the operation of the system, disconnect the cables, and separate the enclosures, in order to provide maintenance for the equipment M1, M2, . . .

Furthermore, advancement in high integration density of semiconductor parts provides an increase of input-output signal terminals of the printed circuit board unit mounting the equipment. This places a shelf and rack accommodating the equipment in a position which requires connecting terminals in multiple faces; that is, it increases the sides which require checking and maintenance. This tendency becomes distinctive as a system becomes large in scale, having more circuits in the higher integration density.

FIG. 1B shows another known enclosure structure wherein an empty enclosure 1, which does not accommodate any electronic equipment for the purpose of connection, is provided. Each side of the empty enclosure is closely placed face to face with other enclosures L2, L3 and L4, through the inter-enclosure connection. Cables 2a and 2b extending through the empty enclosure 1 interconnect the equipment. The enclosures L2, L3 and L4 may thus be maintained, even at the connecting side, from the direction of the empty enclosure 1, as indicated by the arrows. Two of the enclosures L3 and L4 may be maintained from all sides. A close layout is provided for the side which does not always require maintenance. A closely arranged layout is provided, as in the case of the enclosures L2 and L1, and the enclosures L2 and L5. In this structure, the maintenance surface may be assured by providing the empty enclosure 1 at the side where accessibility or maintainability is lost due to the close arrangement. However, the length of the cable becomes long and, simultaneously, a particular connecting enclosure must be provided, resulting in an increase of cost and an increase of useless installation space which cannot be used freely.

FIG. 1C shows still another known connecting structure having a longer connecting bus enclosure 3. The enclosures L1, L2, L3, ... are arranged in zig-zag fashion on both sides of the bus enclosure 3 through an inter-enclosure connection, with the cables 4a, 4b, 4c and 4d extending in said bus enclosure. In this case, the enclosures may be connected by the bus connection method, and the embodiment is particularly suitable for a large scale system. However, the lengths of the connecting cables become long, as in the foregoing embodiment, and maintenance of the enclosure at the side of the connecting or bus enclosure 3 must be accomplished from the rear through said connecting enclosure, as indicated by the arrows, requiring extra installation space of said enclosure and thus increasing the cost.

Figure 3:
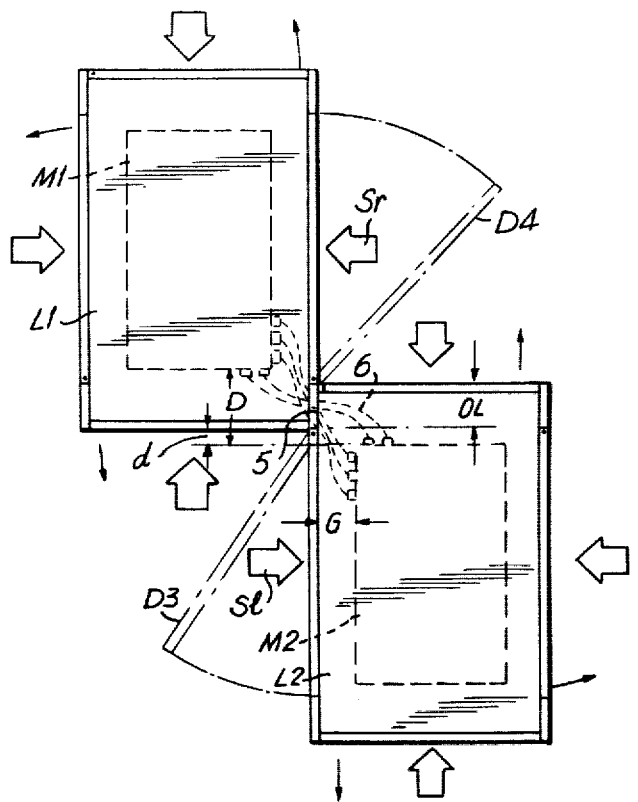
FIG. 3 is a plan view, on a reduced scale, of the two enclosure connecting structure of FIG. 2.

The electronic equipment enclosure connecting structure of the invention for two enclosures is shown in, and described with reference to, FIGS. 2, 3 and 4. In accordance with the invention, and as shown in FIGS. 2 and 3, the enclosures L1 and L2 are directly connected to each other at their abutting sides. In this case, the entire adjacent surfaces of the adjacent enclosures L1 and L2 are not arranged in close proximity, as in FIG. 1, but are overlapped and connected only at overlap or connecting portions 5 near the corners of the enclosures, and particularly for a distance dimension OL (FIG. 3).

The connecting, interconnectiing or inter-enclosure cable 6 between the enclosures L1 and L2 extends through the overlap portion 5 (FIG. 3). For this purpose, the minimum overlap dimension OL should be sufficient to accommodate the interconnecting cable 6. In addition, the value of the maximum overlap dimension OL should be selected in the range which provides an interval D between the electronic equipment M1 and M2 in the enclosure, as shown in FIG. 3, and which prevents overlapping of said electronic equipment.

In the structure of FIGS. 2 and 3, the enclosures L1 and L2 may be maintained from all four surfaces, as indiated by the arrows. In addition, the overlap portion at the corners of the enclosures L1 and L2 may have a shape such as, for example, a slanting surface, determined by a chamfered corner, as shown in FIG. 6C.

Figure 4:
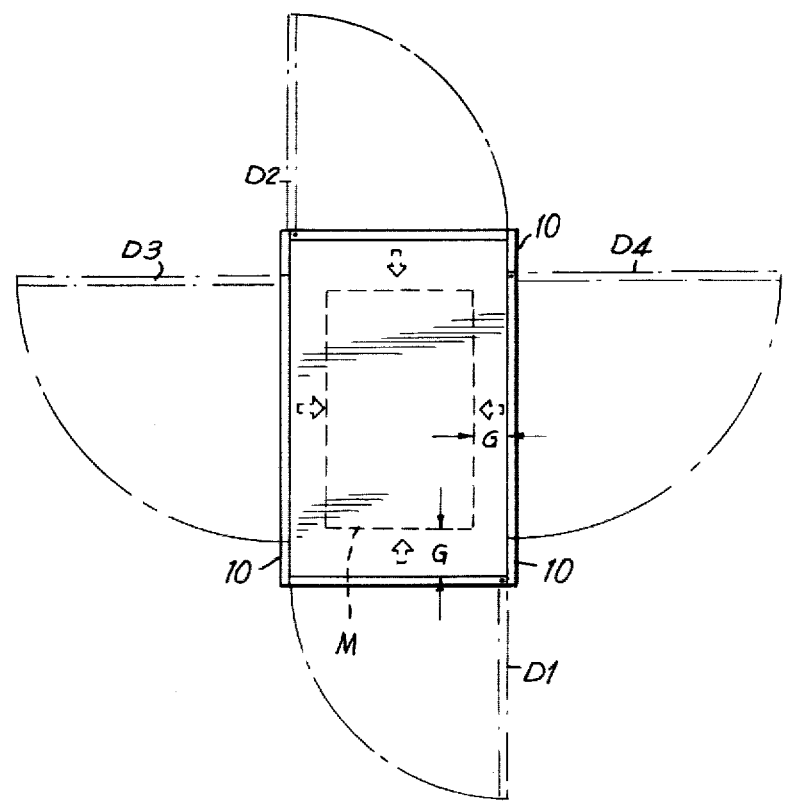
FIG. 4 is a plan view of a single enclosure of the two enclosure connecting structure of FIG. 3.

Each enclosure has doors D1, D2, D3 and D4 in its four surfaces, respectively, as shown in FIG. 4, for the convenience of access and maintenance from all said surfaces. The doors are not limited to the hinge type, only, as shown in FIG. 4, but may be mounting types, etc., which may be isolated from the enclosure frame. At any rate, when a door is opened, the internal electronic equipment M is accessible and therefore checking and maintenance may be accomplished freely.

Since a space G is provided between the internal electronic equipment M and the door or side wall of the enclosure (FIGS. 3 and 4), the inter-enclosure cable 6 and inter-shelf or inter-unit cable of the equipment M may be accommodated in said space. Therefore, in accordance with the invention, the length of the cable may be drastically curtailed, as compared with the length of the cable of known embodiments, as shown in FIGS. 1A, 1B and 1C, by wiring the inter-enclosure cable 6 to extend in the space G and through the enclosure overlap portion 5, as shown in FIG. 3. Furthermore, since the corners of the enclosures L1 and L2 are overlapped in a manner whereby the internal electronic equipment units M1 and M2 do not overlap, checking and maintenance of the overlap corner may also be accomplished for the entire part from directions indicated by the arrows Sl and Sr by providing the doors D3 and D4 in parts of the abutting side other than the overlap part or portion 5 (FIG. 3).

The enclosure connecting structure of the invention permits the exposure of, or accessibility to, all surfaces of the internal electronic equipment M1 and M2 in the enclosures L1 and L2 and permits checking and maintenance from all surfaces. Ideally, it is desirable that the internal electronic equipment M1 and M2 in the enclosures L1 and L2, respectively, do not overlap and that a small space d is provided (FIG. 3). If the electronic equipment units M1 and M2 overlap slightly, however, this does not result in a problem of checking and maintenance because of the space G.

Figure 5A:
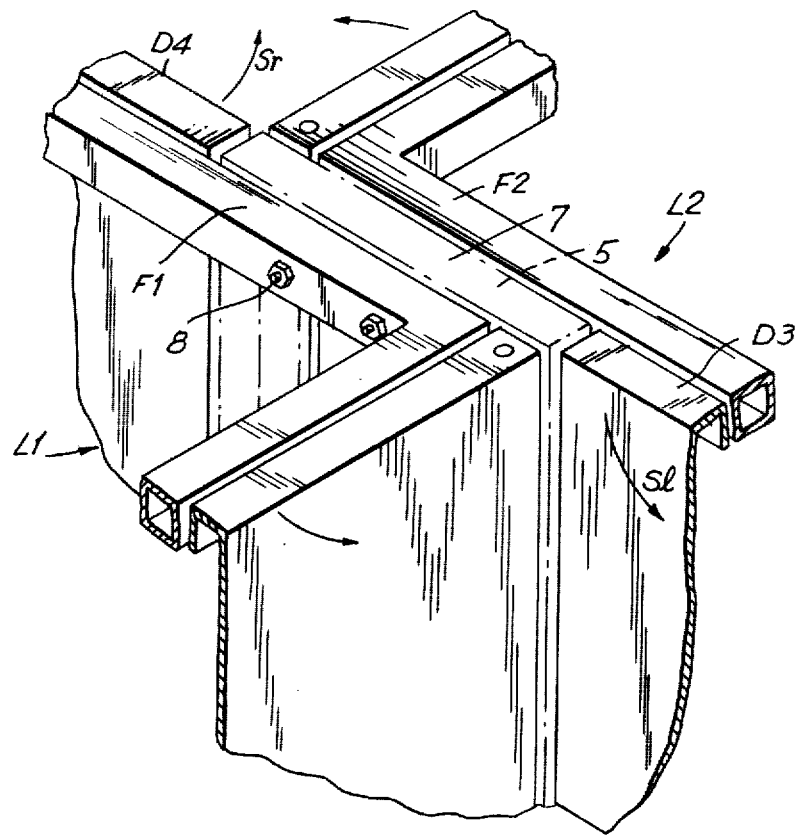
FIG. 5A is a perspective view, on an enlarged scale, partly cut away, of the enclosure connecting part of the two enclosure connecting structure of FIG. 2.
Figure 5B:
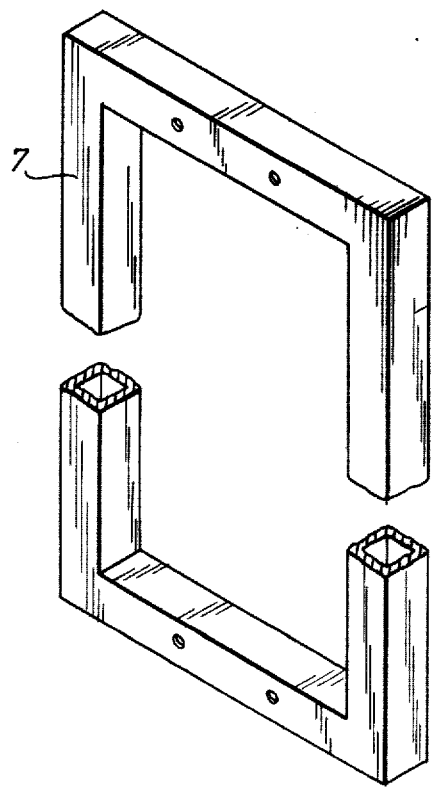
FIG. 5B is a perspective view, partly cut away, of the frame of the two enclosure connecting structure of FIG. 5A.

FIGS. 5A and 5B are views of the enclosure connecting part of the two enclosure connecting structure of FIGS. 2 and 3. FIG. 5A is a perspective view of the overlap part, portion or area 5, structured by engaging a square frame 7 (FIG. 5B) in the space between the door D3 in the side of the enclosure L2 and the door D4 in the side of the enclosure L1, and between the frame F1 of the enclosure L1 and the frame F2 of the enclosure L2. Thus, the interconnecting cable 6 (FIG. 3) extends through the frame 7. Connecting bolts 8 secure the frames F1 and F2 to each other. When the enclosures L1 and L2 need not be connected to each other, a side wall or side panel 10, as shown in FIG. 4, is affixed to the overlap portion 5, instead of the connecting frame 7.

Figure 6A:
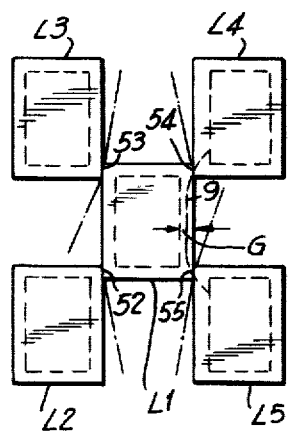
FIG. 6A is a plan view, on a reduced scale, of an embodiment of the electronic equipment enclosure connecting structure of the invention for more than three enclosures.
Figure 6B:
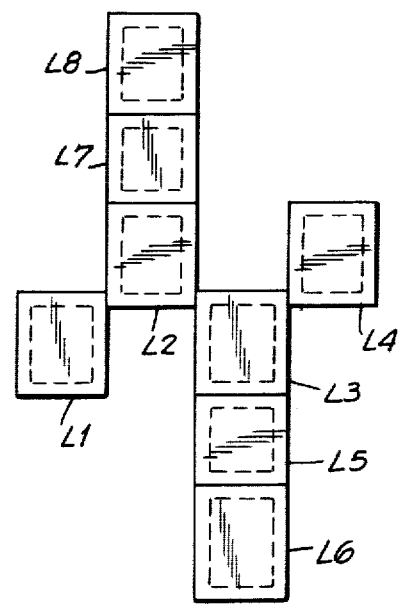
FIG. 6B is a plan view, on a reduced scale, of another embodiment of the electronic equipment enclosure connecting structure of the invention for more than three enclosures.
Figure 6C:
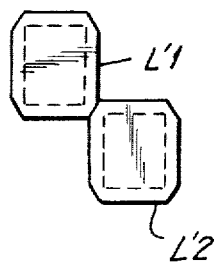
FIG. 6C is a plan view, on a reduced scale, of a modification of the two enclosure connecting structure of FIG. 2.

FIG. 6A is a plan view of an embodiment of the electronic equipment enclosure connecting structure of the invention for more than three enclosures and FIG. 6B is a plan view of another embodiment of the enclosure connecting structure of the invention for more than three enclosures. In the embodiment of FIG. 6A, four enclosures L2, L3, L4 and L5 are connected to the respective corners of the enclosure L1. In the embodiment of FIG. 6A, since the center enclosure L1 and the other enclosures are overlapped at the corners 52 to 55 in a manner whereby the internal electronic equipment units do not overlap, access, checking and maintenance may be accomplished from all surfaces by providing sufficiently broad doors, indicated by dot-dash lines, for all the enclosures.

In the embodiment of FIG. 6A, the interconnecting cables such as, for example, a cable 9, between the enclosures L4 and L5, which is not installed between next-adjacent enclosures, extends through the overlap portion or corner 54, the space G of the enclosure L1 and the overlap portion or corner 55. Since the overlap portions are of the dimension OL, as shown in FIG. 3, the length of the inter-enclosure connecting cable 9 between the enclosures L4 and L5 is likely to be shorter than the length of the interconnecting cable of the known embodiments of FIGS. 1A, 1B and 1C, and is certainly never longer than the length of the cable of the known embodiments.

The embodiment of FIG. 6B is a combination of the enclosure connecting structure of the invention and the known structure of FIG. 1A. In FIG. 6B, the enclosures L1 to L4 are arranged in zig-zag fashion, utilizing the concept of the invention and the enclosures L3, L5, L6, respectively, and L2, L7, L8, respectively, are closely arranged in a simple linear manner. Various layouts, other than that shown and described, may be used. Furthermore, each enclosure is not limited in configuration to a complete rectangular parallelepiped, and may be a prism, as shown in FIG. 6C. Also, even when additional equipment, such as a cooling air duct, etc., is provided at the side near the overlap or connecting portion, there is no inconvenience as long as it may easily be removed at the time of checking and maintenance, so that no obstacle remains in the electronic equipment maintenance areas.

As hereinbefore explained, in the enclosure connecting structure of the invention, a pair of enclosures are directly connected to each other by overlapping only their corner portions. This permits access to, checking and maintenance of the internal electronic equipment via the doors at every surface. The enclosure connecting structure of the invention is particularly effective for electronic equipment having high integration density, similar to recently, newly developed equipment which requires that each of its surfaces be a maintenance surface.

In the enclosure connecting structure of the invention, non-use of a particular connecting enclosure does not result in increased cost and useless installation space. Furthermore, since the inter-enclosure connecting cable may extend via the shortest route between the connected enclosures, the length of a signal line may be shortened, so that the line is suitable for a high speed computer system. On the other hand, when the side panel 10, other than the doors shown in FIG. 4, is readily removable, a plurality of enclosures may be easily connected to each other only by removing the side panel 10 of an individual enclosure. This permits easy standardization of the enclosure supporting structure.

While the invention has been described by means of specific examples and in specific embodiments, we do not wish to be limited thereto, for obvious modifications will occur to those skilled in the art without departing from the spirit and scope of the invention.

We claim:

1. An electronic equipment enclosure connecting structure which connects electronic equipment units, the electronic equipment units being electrically connected to each other by an interconnecting cable, said electronic equipment enclosure connecting structure comprising
at least two enclosures, each accommodating an electronic equipment unit and each having a plurality of sides and a plurality of corners, said enclosures abutting each other at an overlap portion of a side of each next-adjacent a corner thereof and being connected to each other at the corner overlap portion of each, the interconnecting cable passing through the corner overlap portions and thereby connecting the electronic equipment units in a minimum distance.

2. An electronic equipment enclosure connecting structure as claimed in claim 1, wherein each of said electronic equipment units has a plurality of sides each spaced from a corresponding side of the enclosure accommodating it, and said interconnecting cable further extends in spaces between corresponding sides of said enclosures and said electronic equipment units.

3. An electronic equipment enclosure connecting structure as claimed in claim 1, wherein each of said enclosures is a rectangular parallelepiped and at least one of said enclosures has a plurality of doors, each in a corresponding one of a plurality of its sides, for access to the electronic equipment units.

4. An electronic equipment enclosure connecting structure as claimed in claim 1, wherein each of said enclosures has a side in face-to-face relation with that of another of said enclosures and spaced opposite ends, each of said enclosures having a corner thereat, said enclosures abutting each other at an overlapping corner part of the face-to-face sides, and further comprising a connecting frame between said enclosures and securing said enclosures to each other.

5. An electronic equipment enclosure connecting structure as claimed in claim 1, wherein each of said enclosures has a side in face-to-face relation with that of another of said enclosures and spaced opposite ends, each of said enclosures having a corner thereat, said enclosures abutting each other at an overlapping corner part of the face-to-face sides, each of said enclosures having a door in said side for access to the electronic equipment units, each of the doors being spaced from the ends of its corresponding side, and further comprising a pair of side panels each affixed to a corresponding one of said sides around the corresponding door.

6. An electronic equipment enclosure connecting structure which connects electronic equipment units, the electronic equipment units being electrically connected to each other by an interconnecting cable, said electronic equipment enclosure connecting structure comprising
at least two enclosures, each accommodating an electronic equipment unit and each having a plurality of sides and a plurality of corners, at least one of which is chamfered, said enclosures abutting each other at a chamfered corner of each and being connected to each other at their abutting chamfered corners, the interconnecting cable passing through the connected chamfered corners and thereby connecting the electronic equipment units in a minimum distance.

* * * * *